(12) United States Patent
Yakub

(10) Patent No.: US 9,404,198 B2
(45) Date of Patent: Aug. 2, 2016

(54) PROCESSES AND APPARATUSES FOR MANUFACTURING WAFERS

(71) Applicant: Andrew X. Yakub, Stevenson Ranch, CA (US)

(72) Inventor: Andrew X. Yakub, Stevenson Ranch, CA (US)

(73) Assignee: Rayton Solar Inc., Santa Monica, CA (US)

(*) Notice: Subject to any disclaimer, the term of this patent is extended or adjusted under 35 U.S.C. 154(b) by 59 days.

(21) Appl. No.: 13/954,868

(22) Filed: Jul. 30, 2013

(65) Prior Publication Data

US 2014/0026617 A1    Jan. 30, 2014

Related U.S. Application Data

(60) Provisional application No. 61/677,392, filed on Jul. 30, 2012.

(51) Int. Cl.
| | |
|---|---|
| C30B 33/06 | (2006.01) |
| C30B 13/24 | (2006.01) |
| C30B 33/04 | (2006.01) |
| B28D 1/02 | (2006.01) |
| B28D 5/00 | (2006.01) |
| C30B 29/06 | (2006.01) |

(52) U.S. Cl.
CPC . *C30B 33/04* (2013.01); *B28D 1/02* (2013.01); *B28D 5/00* (2013.01); *C30B 13/24* (2013.01); *C30B 29/06* (2013.01); *C30B 33/06* (2013.01)

(58) Field of Classification Search
CPC ...... B21D 28/06; B21D 31/046; B21C 37/02; C30B 33/04; C30B 33/06
USPC ............... 164/250.1, 262–265; 83/39–50
See application file for complete search history.

(56) References Cited

U.S. PATENT DOCUMENTS

| | | | | |
|---|---|---|---|---|
| 3,453,097 A | * | 7/1969 | Hafner | B23K 26/18 219/121.67 |
| 4,309,239 A | * | 1/1982 | Rodot nee Fumeton | C30B 15/002 117/15 |
| 4,568,407 A | * | 2/1986 | Barbieri | B26F 1/3846 156/510 |
| 5,808,274 A | * | 9/1998 | Lee | H01L 21/67132 219/121.72 |
| 6,013,563 A | * | 1/2000 | Henley | B81C 1/0038 257/E21.088 |

(Continued)

FOREIGN PATENT DOCUMENTS

| | | | | |
|---|---|---|---|---|
| WO | WO 9852212 A1 | * | 11/1998 | |
| WO | WO2007/016985 | * | 2/2015 | B23K 26/00 |

*Primary Examiner* — Jodi C Franklin
(74) *Attorney, Agent, or Firm* — Lowry Blixseth LLP; Scott M. Lowry

(57) ABSTRACT

The process for manufacturing wafers includes the steps of mounting an ingot as a work piece in a manner that permits rotation about a longitudinal axis of rotation and rotating the ingot about its longitudinal axis of rotation to permit a microwave device that generates an energized beam to penetrate an outer surface layer thereof. Furthermore, the process includes exfoliating the outer surface layer with the energized beam, removing the exfoliated outer surface layer from the ingot as a continuous planar strip and cutting the continuous planar strip into a wafer.

26 Claims, 7 Drawing Sheets

(56) References Cited

U.S. PATENT DOCUMENTS

| | | | | |
|---|---|---|---|---|
| 6,220,056 B1 * | 4/2001 | Ostendarp | B65G 49/065 | 406/88 |
| 6,407,505 B1 * | 6/2002 | Bertsche | H05H 9/04 | 315/5.41 |
| 6,423,930 B1 * | 7/2002 | Matsumoto | C03B 33/091 | 219/121.69 |
| 6,528,391 B1 | 3/2003 | Henley et al. | | |
| 6,568,384 B1 * | 5/2003 | Onizaki | B28D 5/007 | 125/16.02 |
| 6,582,999 B2 | 6/2003 | Henley et al. | | |
| 6,602,736 B1 * | 8/2003 | Matsuoka | H01L 21/67092 | 257/783 |
| 6,632,724 B2 | 10/2003 | Henley et al. | | |
| 6,941,940 B1 * | 9/2005 | Zavattari | B23D 57/0061 | 125/16.02 |
| 7,223,155 B2 * | 5/2007 | Matsumoto | B28D 5/045 | 125/16.02 |
| 7,699,050 B2 * | 4/2010 | Oishi | B28D 5/045 | 125/16.01 |
| 7,939,812 B2 * | 5/2011 | Glavish | H01J 37/08 | 250/281 |
| 7,976,629 B2 * | 7/2011 | Brailove | B28D 1/221 | 117/26 |
| 7,982,197 B2 * | 7/2011 | Smick | H01J 37/20 | 250/396 ML |
| 7,989,784 B2 * | 8/2011 | Glavish | H01J 37/05 | 250/396 ML |
| 8,044,374 B2 * | 10/2011 | Ryding | H01J 37/05 | 250/396 ML |
| 8,146,581 B2 * | 4/2012 | Kitagawa | B26B 27/0633 | 125/12 |
| 8,212,180 B2 * | 7/2012 | Eberhardt | C03B 33/091 | 219/121.67 |
| 8,449,285 B2 * | 5/2013 | McGeehan | C12M 33/02 | 264/2.5 |
| 2002/0056519 A1 | 5/2002 | Henley et al. | | |
| 2004/0083863 A1 * | 5/2004 | Nakashima | B28D 5/0082 | 83/13 |
| 2004/0140534 A1 * | 7/2004 | Yoshihara | H01L 21/6835 | 257/632 |
| 2005/0101109 A1 * | 5/2005 | Chin | H01L 21/67092 | 438/464 |
| 2005/0227020 A1 * | 10/2005 | Sharafutdinov | B01J 19/085 | 427/596 |
| 2007/0235070 A1 * | 10/2007 | Ila | H01L 35/22 | 136/224 |
| 2007/0281239 A1 * | 12/2007 | Uematsu | G03G 5/043 | 430/133 |
| 2009/0056513 A1 | 3/2009 | Baer | | |
| 2009/0084373 A1 * | 4/2009 | Oishi | B28D 5/045 | 125/20 |
| 2009/0140177 A1 * | 6/2009 | Whittum | H05H 9/04 | 250/493.1 |
| 2010/0127169 A1 * | 5/2010 | Whittum | G01V 5/0041 | 250/306 |
| 2011/0037195 A1 * | 2/2011 | Hildeman | B29C 41/26 | 264/212 |
| 2011/0158683 A1 * | 6/2011 | Okuda | G03G 5/0564 | 399/111 |
| 2011/0186554 A1 * | 8/2011 | Koyanagi | B23K 26/00 | 219/121.72 |
| 2011/0300691 A1 * | 12/2011 | Sakamoto | B23K 26/0057 | 438/462 |
| 2012/0135585 A1 * | 5/2012 | Shimoi | H01L 21/78 | 438/463 |
| 2013/0193617 A1 * | 8/2013 | Zhang | B23K 26/38 | 264/400 |
| 2013/0270238 A1 * | 10/2013 | Nawrodt | B23K 26/367 | 219/121.69 |
| 2013/0292691 A1 | 11/2013 | Henley et al. | | |
| 2014/0117384 A1 * | 5/2014 | Tam | H01L 33/005 | 257/88 |

* cited by examiner

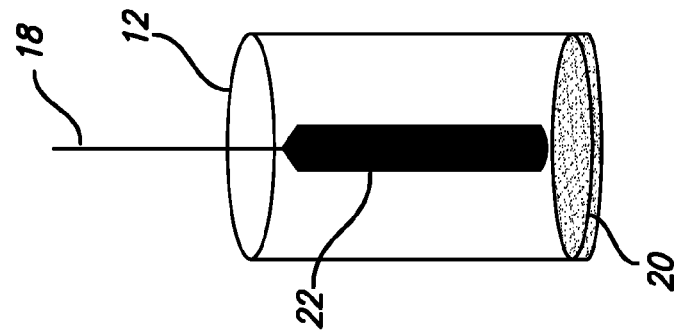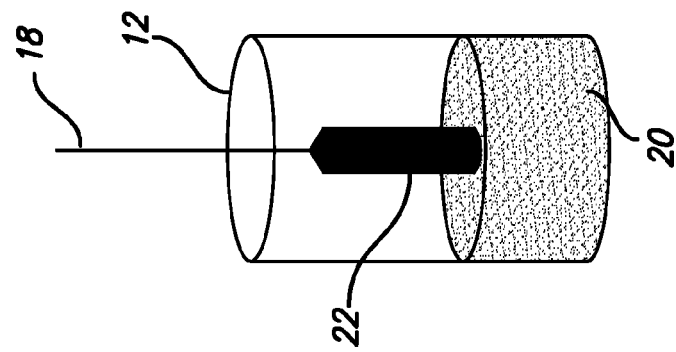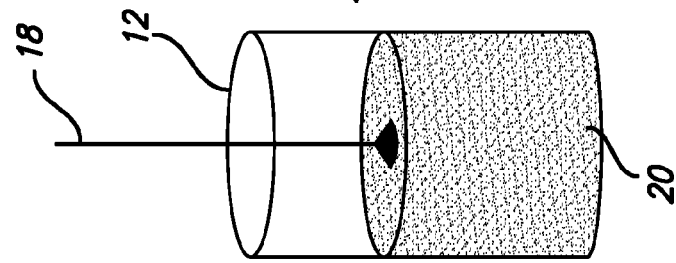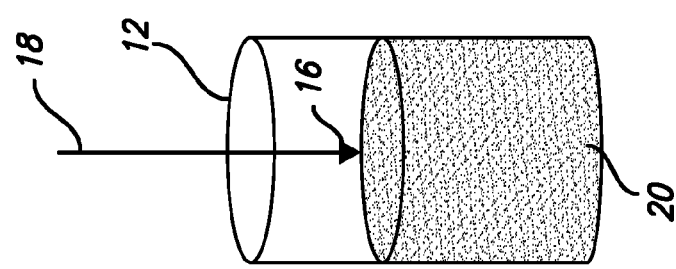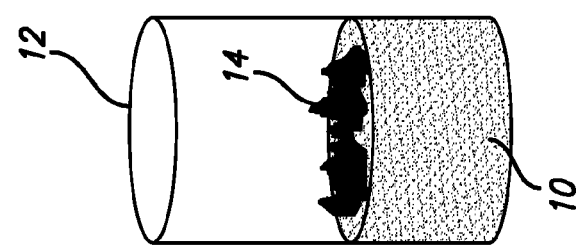

PROCESSES AND APPARATUSES FOR MANUFACTURING WAFERS

BACKGROUND OF THE INVENTION

The present invention generally relates to processes and apparatuses for manufacturing wafers. More particularly, the invention relates to processes and apparatuses for exfoliating the external surface of an ingot to more efficiently produce solar grade photovoltaic wafers and the like therefrom.

Conventionally, a wafer material such as monocrystalline silicon is processed into solar grade photovoltaic ("PV") wafers by first creating a single crystalline cylindrical ingot of silicon. The ingot is created by melting high-purity semiconductor-grade wafer material in an inert chamber, such as one made of quartz. Dopant impurity atoms such as boron, phosphorus, arsenic, or antimony may be added to the molten wafer material in precise amounts (e.g., on the order of $10^{13}$ or $10^{16}$ atoms per $cm^3$) to define the material as either a bulk n-type (negative) or p-type (positive) semiconductor, which gives the wafer material the desired electrical properties. Then, a rod-mounted seed crystal is dipped into the molten wafer material and slowly pulled upwards and rotated simultaneously to extract a preferably single-crystal cylindrical ingot. Controlling the temperature gradient, extraction rate, and rotation speed facilitates the production of a single ingot with only trace amounts of unwanted instabilities. The process is normally performed in an inert atmosphere such as argon.

Individual wafers are basically created by slicing a thin layer of the semiconductor material off from this larger ingot. Wafers may be square, rectangular or circular and are frequently used in the fabrication of integrated circuits and other micro or electronic devices, such as solar panels. In one example, circular wafers are sliced off the end of the cylindrical ingot by a diamond coated wire roughly 20 micrometers in diameter. The problem with this production method is that the diamond wire shaves a portion of the ingot into dust in a thickness equal to the diameter of the diamond coated wire. Thus, for each circular wafer created, at least 20 micrometers of wafer material is wasted as dust residue.

But, these circular wafers are not preferred for use with solar panels because square or rectangular wafers better maximize surface area exposure to sunlight energy. To make square or rectangular wafers, the stock cylindrical ingot is, instead, first squared into an elongated rectangular box shape approximately 1.5 meters long. This squaring process uses a similar conventional 20 micrometer diameter diamond coated wire. Similar to the above, portions of the exterior of the ingot are lost to dust as the diamond wire cuts through portions of the ingot to form the rectangular block. Furthermore, this squaring process requires relatively large chunks of valuable and expensive wafer material to be chopped off and thrown away to square the cylindrical ingot. From here, individual square or somewhat rectangular wafers are sliced off the end of the rectangular semiconductor block, as described above with respect to the circular wafers. While hundreds of relatively square or rectangular wafers ranging in thickness from 160 to 200 micrometers can be sliced off this rectangular semiconductor block, each wafer cut wastes an amount of wafer material equal to the width of the diamond wire cutting the semiconductor block. Another drawback in cutting wafers with a diamond-coated wire is that the saw can cause surface damage to the wafer that requires repair.

Recently, newer technologies have been developed to create additional, thinner wafers from existing wafers cut from the silicon ingot or rectangular silicon block, as described above. For example, U.S. Pat. No. 7,939,812 to Glavish et al., U.S. Pat. No. 7,982,197 to Smick et al., U.S. Pat. No. 7,989,784 to Glavish et al., and U.S. Pat. No. 8,044,374 to Ryding et al., the contents of each reference are herein incorporated by reference in their entireties, disclose a hydrogen ion implanter used to exfoliate silicon wafers to produce a thinner lamina of crystalline semiconductor material. In this respect, the ion implanter penetrates the surface of a silicon wafer to a certain depth. This penetrated layer of silicon can then be peeled back away from the silicon wafer (i.e., exfoliated)—effectively creating a thinner silicon wafer using the original silicon wafer as a workpiece. Using this exfoliation process, a silicon wafer workpiece on the order of 160-200 micrometers can be used to create 8-10 new silicon wafers having a thickness of approximately 20 micrometers, with nearly no silicon material wasted during the process. Further to this concept, U.S. Pat. Nos. 8,058,626 and 8,089,050, both to Purser et al., the contents of which are both herein incorporated by reference, disclose embodiments for creating a modified ribbon-shaped ion beam having an elongated cross-section normal to the beam direction for use in the aforementioned process for implanting ions into the surface of a substrate.

The current exfoliation processes, such as those described above, require two steps to create a sheet of exfoliated wafer material. More specifically, individual wafers are exfoliated from an ingot in one process step and then the exfoliated layer or wafer is removed from the ingot in a second process step. This two-step conventional process is costly and time consuming by virtue of to its multi-step nature. Furthermore, this conventional process produces a large number of individual exfoliated sheets of wafer material that are relatively expensive to handle and stamp into individual wafers.

There exists, therefore, a significant need in the art for a processes and related apparatuses for more efficiently producing square and rectangular wafers from a stock ingot. Such processes and related apparatuses may include steps for mounting an ingot for rotation about its axis, penetrating a selected layer of the outer surface of the ingot, exfoliating away this bombarded layer of wafer material as the ingot rotates about its axis, and conveying that strip of material to a press to be sliced into individual wafers, all without the waste associated with cutting the cylindrical ingot into a block or slicing individual wafers with a diamond saw. Such processes and apparatuses should further be able to simultaneously exfoliate and remove a single continuous sheet of wafer material from the ingot. The present invention fulfills these needs and provides further related advantages.

SUMMARY OF THE INVENTION

The process for manufacturing wafers as disclosed herein includes the steps of mounting an ingot as a work piece in a manner that permits rotation about a longitudinal axis of rotation and rotating the ingot about the longitudinal axis of rotation. Preferably, the ingot is in the shape of a cylinder and carried by a rotatable shaft mountable to a rotor that facilitates the rotation of the cylindrical ingot about its longitudinal axis of rotation. The ingot may be made from monocrystalline or polycrystalline silicon. A microwave device for generating an energized beam sufficient for penetrating an outer surface layer of the rotating ingot is then energized. Accordingly, the outer surface layer of the rotating ingot is exfoliated with the energized beam. As the ingot continues to rotate, the exfoliated outer surface layer can then be removed from the ingot work piece as a continuous planar strip that can be cut into a wafer. At this time, the continuous planar strip may be transported along a conveyor moving at approximately the same speed as and preferably substantially synchronized with the angular velocity of the rotating ingot. In the event the ingot is incrementally rotated, the conveyor would also incrementally move the continuous planar strip forward in a similar incremental movement. Of course, the continuous strip may be cut or stamped by a press into a plurality of wafers.

Additionally, the wafer manufacturing process may also include the step of cooling the ingot at a penetration point where the energized beam bombards the outer surface layer of said ingot to prevent the chemical properties of the ingot material from changing as a result of increased local temperatures. Such a cooling step can be particularly preferred when the energized beam operates at an energy level between 0.3-1.7 megaelectron volts. The microwave device may be a klystron that generates an energized beam that includes a proton beam or an ion beam. Preferably, the microwave device is calibrated to maximize a Q value. Additionally, the energized beam may include multiple energized beams that simultaneously exfoliate respective outer surface layers of the rotating ingot, to simultaneously create multiple respective exfoliated outer surface layers that can be peeled or removed from the ingot work piece. In one embodiment, the energized beam(s) are approximately the width of the finalized wafer product. For example, the wafer may be square and have a width of between 160-200 mm with an outer surface layer thickness between 3-30 micrometers.

In another process for manufacturing wafers as disclosed herein, an ingot formed in the shape of a cylinder and carried by a rotatable shaft is mounted to a rotor capable of rotating the cylindrical ingot about its longitudinal axis of rotation. Next, the rotor activates and rotates the cylindrical ingot such that an energized beam generated by a microwave device can penetrate a predetermined outer surface layer of the rotating ingot. This permits the manufacturing process to exfoliate the outer surface layer away from the cylindrical ingot work piece as a continuous planar strip along a conveyor synchronized with the rotating ingot. The cylindrical ingot work piece may be cooled at the penetration point where the energized beam bombards the outer surface layer, to prevent the chemical properties of the ingot material from changing as a result of increased localized temperatures. The continuous strip of material is then stamped into a plurality of wafers usable in, for example, a solar panel or the like.

The microwave device may be calibrated to maximize a Q value so that an energized beam having an energy level between 0.3-1.7 megaelectron volts efficiently penetrates the outer surface of the rotating cylindrical ingot. In one embodiment, the microwave device is a klystron that generates a proton or ion energized beam. Moreover, the process may include the use of multiple energized beams that simultaneously exfoliate respective outer surface sections of the rotating ingot, to more efficiently exfoliate the outer surface of the ingot along its entire vertical height. The energized beam is preferably approximately the width of the wafer product, such as between 160-200 mm. The cylindrical ingot may be made from monocrystalline or polycrystalline silicon and be rotated incrementally so that approximately an outer surface layer thickness between 3-30 micrometers is exfoliated.

The apparatus for manufacturing a wafer includes a rotator configured to selectively mountably receive and rotate an ingot work piece about a longitudinal axis of rotation. The ingot is preferably cylindrical and may be made from monocrystalline or polycrystalline silicon. A microwave for producing an energized beam is positioned relative to the rotator such that the emitted energized beam aligns with the longitudinal axis of rotation of the rotating ingot. The energized beam is preferably of an energy level sufficient to penetrate an outer surface layer of the rotating ingot. A water cooler or an air cooler positioned proximate to a penetration point where the energized beam bombards the outer surface layer of the ingot may control the surface temperature therein during the manufacturing. The apparatus also includes a conveyor synchronized with the rotating ingot to transversely carry as a continuous planar strip an exfoliated outer surface layer away from the rotating ingot. This continuous planar strip is then cut into one or more wafers by a cutting mechanism. In this respect, such a cutting mechanism may include a stamping die that cuts the continuous strip into multiple wafers with each stroke. The final wafer product is preferably of a width between 160-200 mm and a thickness between 3-30 micrometers. In a particularly preferred embodiment, the microwave is a klystron that includes an energy accelerator. To this end, the energized beam may be an ion beam or a proton beam, and is preferred to be elongated beam approximately the width of said wafer.

Other features and advantages of the present invention will become apparent from the following more detailed description, when taken in conjunction with the accompanying drawings, which illustrate, by way of example, the principles of the invention.

BRIEF DESCRIPTION OF THE DRAWINGS

The accompanying drawings illustrate the invention. In such drawings:

FIG. 2A is a diagrammatic view illustrating melting high-purity semiconductor grade wafer material with dopants in an inert chamber;

FIG. 2B is a diagrammatic view illustrating lowering a seed crystal mounted to one end of a rotatable shaft into the melted mixture;

FIG. 2C is a diagrammatic view illustrating catalytic crystallization of the melted mixture to the seed crystal;

FIG. 2D is a diagrammatic view illustrating formation of an ingot through controlled removal of the seed crystal from the mixture;

FIG. 2E is a diagrammatic view illustrating complete formation of an ingot from the melted mixture;

DETAILED DESCRIPTION OF THE PREFERRED EMBODIMENTS

Figure 1:
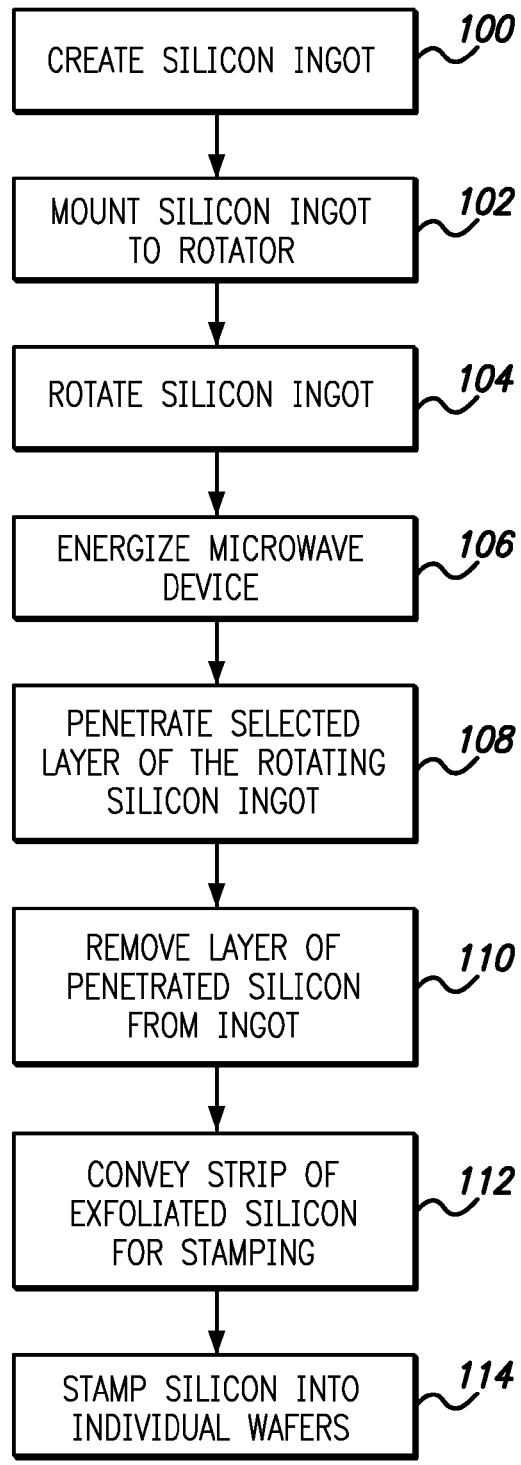
FIG. 1 is a flowchart illustrating the steps used in association with the method and process for manufacturing a wafer in accordance with the present invention.

As shown in the drawings for purposes of illustration, the present invention for the improved processes for manufacturing wafers is shown generally with respect to the flowchart in FIG. 1 and the operation of the manufacturing process is shown in more detail in FIGS. 2-10. More specifically, the first step, as shown in FIG. 1, is to create an ingot 100. In a preferred embodiment, the ingot 100 is a monocyrstalline cylindrical silicon ingot. Although, the ingot 100 may be any material suitable for exfoliation, including polycrystalline silicon, and may have any cross-sectional shape, such as polygonal cross-sectional shape. The processes and apparatuses disclosed herein aim to, inter alia, reduce the waste associated with squaring off a cylindrical ingot used as a workpiece for creating square or rectangular silicon wafers for use with solar panels and the like. Furthermore, the processes and apparatuses disclosed herein are able to further reduce wasted wafer material by at least one order of magnitude for each wafer created in view of eliminating the need to slice individual wafers using the aforementioned diamond coated wire. Accordingly, eliminating both of these wasteful steps in producing solar grade monocrystalline photovoltaic material corresponds to a cost savings of the same magnitude. Thus, as will be described in more detail below, the amount of solar PV material produced increases by a factor of at least 20 over the same ingot used by traditional or conventional manufacturing methods. This obviously corresponds to tremendous cost savings in raw material. Additionally, simultaneously exfoliating and removing a continuous sheet of wafer material from the ingot, as described in more detail below, eliminates the need for the relatively more cost intensive two-step exfoliation process and decreases the costs associated with handling numerous individual sheets of exfoliated wafer material, as is known in the prior art.

As shown in FIG. 2A, high-purity semiconductor-grade wafer material 10 is melted in an inert chamber 12, such as a chamber made from quartz. Although the wafer material 10 may be any material suitable for exfoliation, monocrystalline silicon is the preferred wafer material. Dopants 14 (e.g., boron, phosphorus, arsenic, or antimony) are added to the melted wafer material 10 to add impurities thereto, preferably on the order of $10^{13}$ or $10^{16}$ atoms per $cm^3$ to polarize the composition as a n-type (negative) or p-type (positive) semiconductor. A seed crystal 16 mounted to one end of a rotatable shaft 18 is then lowered into this somewhat impure mixture 20 of the melted wafer material 10 and the dopants 14 to begin the crystallization process as shown in FIG. 2B. The seed crystal 16, once immersed into this mixture 20 as shown in FIG. 2C, acts as a catalyst to start crystallization of the melted wafer material mixture 20 about the shaft 18. The shaft 18 is then slowly pulled upwards and rotated simultaneously to extract a large ingot 22 from the melt. The ingot 22 is preferably a single-crystal cylindrical ingot, although the ingot 22 may be polycrystalline or another composition known in the art. The crystallization of the ingot 22 formed from the mixture 20 is indicated by the decreased amount of the mixture 20 in the inert chamber 12, progressing from FIG. 2C to FIG. 2E. In this respect, FIG. 2E illustrates a preferred ingot 22 for use with the processes disclosed herein.

Persons of ordinary skill in the art will readily recognize that the above-described process for creating the ingot 22 in accordance with step 100 may vary depending on the desired application and end characteristics of the wafer. For example, one may vary the composition of the melted wafer material 10, the amount and/or types of dopants 14 introduced into and mixed with the melted wafer material 10, the temperature in the inert chamber 12, the angular rotating speed of the shaft 18, and the rate of extracting the seed crystal 16. In this respect, the wafer material creation process 100 should be considered well known to those skilled in the art.

Figure 3:
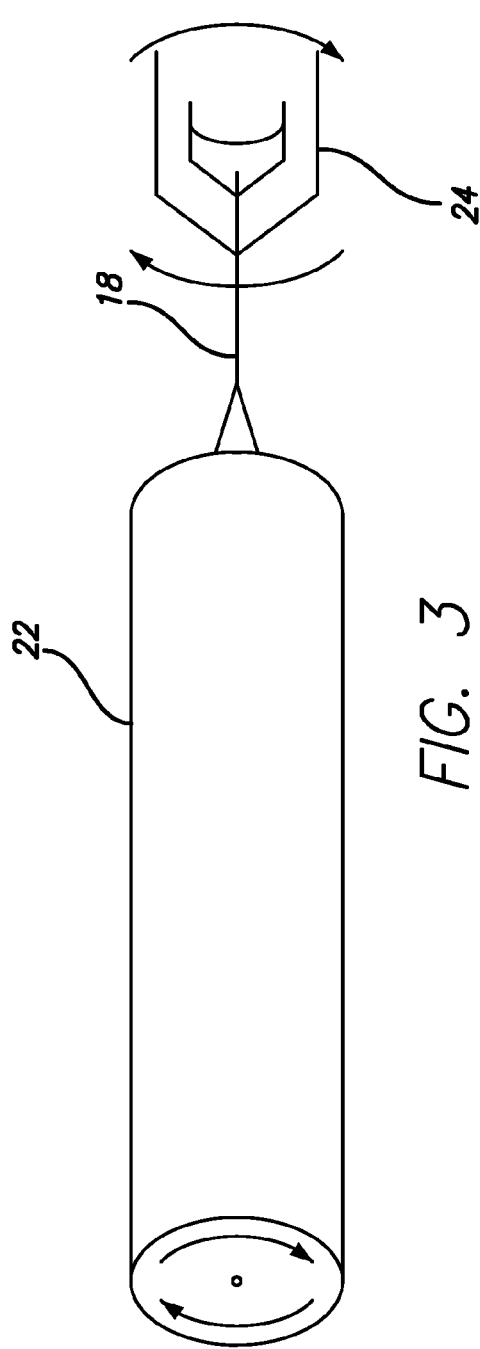
FIG. 3 is a diagrammatic perspective view illustrating mounting of the ingot at one end to a rotator.
Figure 4:
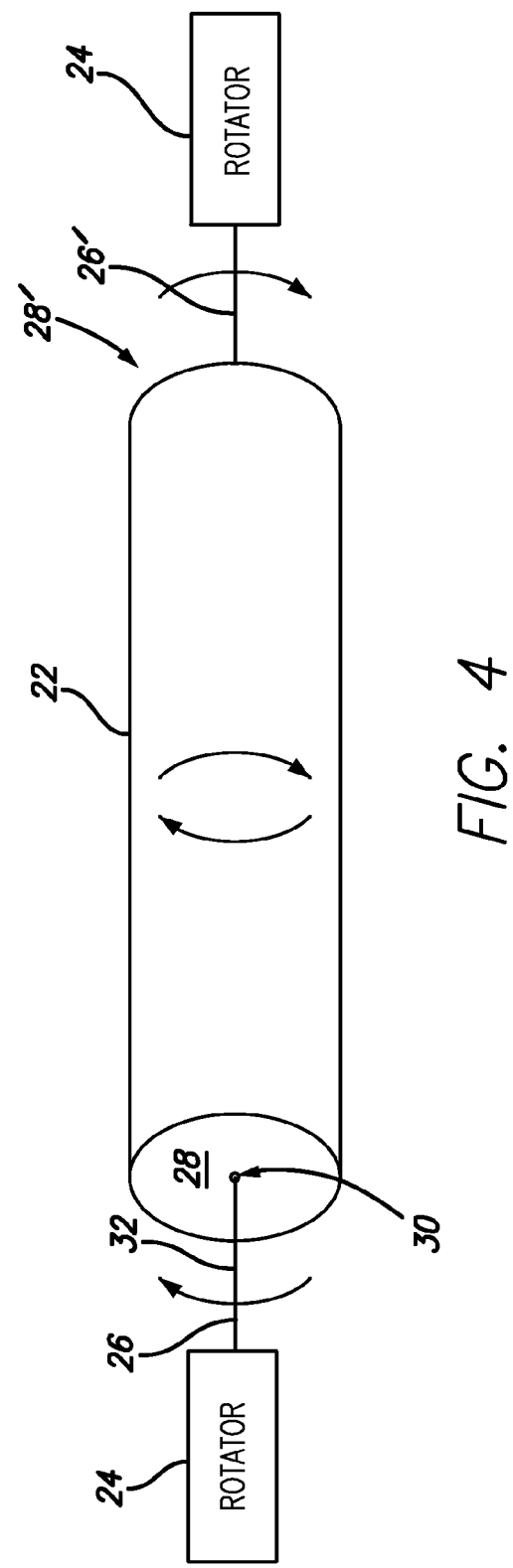
FIG. 4 is a diagrammatic perspective view illustrating rotation of the ingot about its longitudinal axis when alternatively coupled to two rotators.

Once the ingot 22 has been created during step 100, the next step in accordance with FIG. 1 is to mount the ingot 22 to a rotation device 102, such as the rotator 24 illustrated in FIG. 3. In one embodiment, the rotator 24 may couple to the shaft 18 or other extension extending out from the body of the ingot 22. In this embodiment, the rotator 24 is preferably capable of holding and rotating the ingot 22 in the generally horizontal position shown with respect to FIG. 3. Alternatively, as shown in FIG. 4, a pair of rotation arms 26, 26' may extend out from or comprise a portion of the rotator (generally designated as numeral 24) and attach to a pair of planar end surfaces 28, 28' of the ingot 22. Here, the rotation arms 26, 26' may include an attachment mechanism 30 in the form of a grip, clamp, or other device having a high friction surface to retain (e.g., by compression fit) the ingot 22 therebetween. In this respect, any attachment mechanism 30 known in the art capable of supporting and rotating the ingot 22 at a stable and consistent speed in connection with the rotator 24 will suffice. Moreover, the rotator(s) 24, the rotation arms 26, 26' or the attachment mechanism 30 could also be utilized individually or in combination with one another to move the mounted ingot 22 back and forth about its axis of rotation 32 during the ion implantation process, as described in more detail below.

Figure 5A:
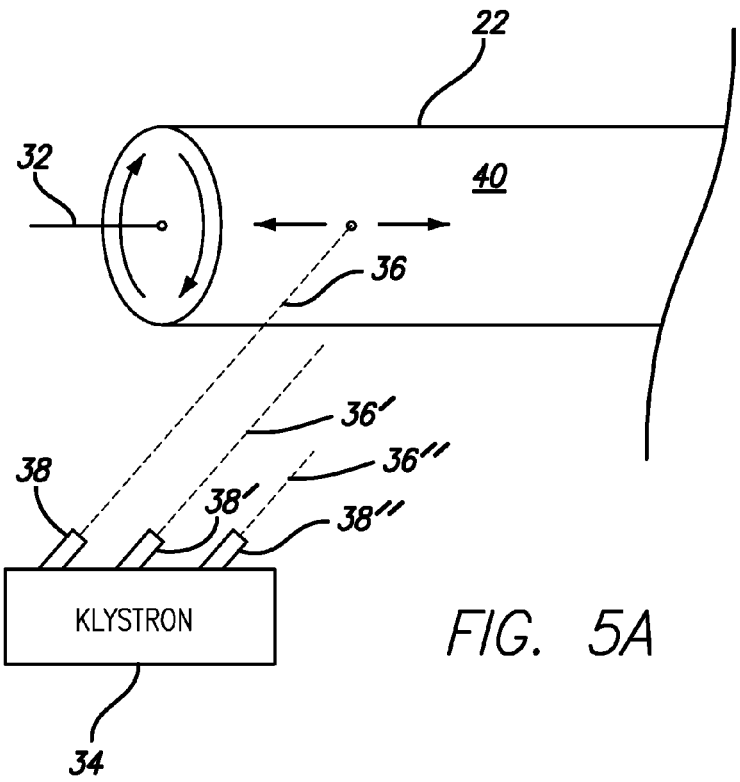
FIG. 5A is a partial cut-away diagrammatic perspective view illustrating bombardment of the outer surface of the ingot with one or more beams.
Figure 5B:
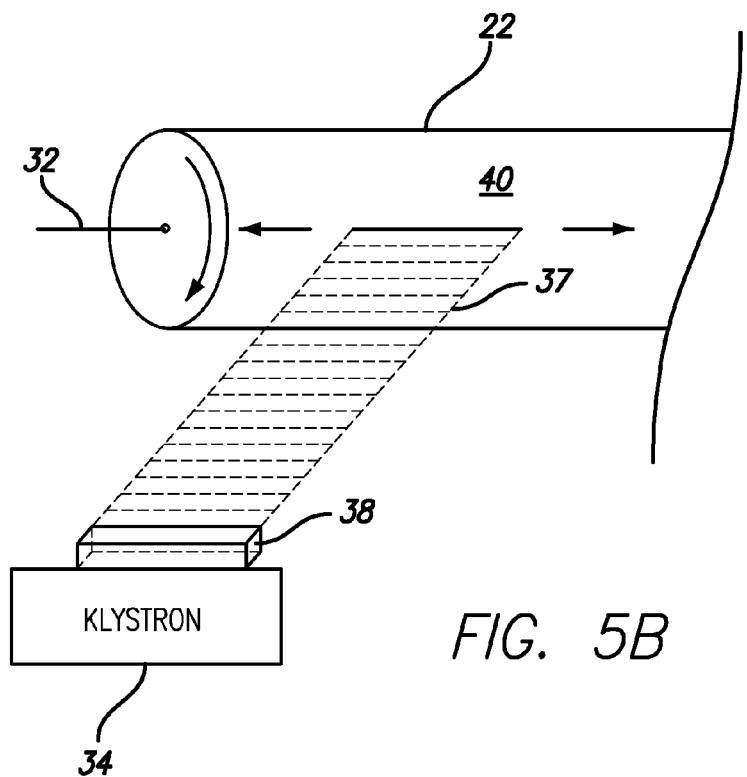
FIG. 5B is an alternative cut-away diagrammatic perspective view illustrating bombardment of the outer surface of the ingot with one or more elongated beams.

The next step as shown in FIG. 1 is to energize a microwave device 106 that produces a beam of energized protons or ions capable of penetrating into the outer surface of the ingot 22 as it rotates about the axis 32. Here, FIGS. 5A and 5B illustrate two examples of such a microwave device for use with the processes disclosed herein. For example, in FIG. 5A, the microwave device includes a klystron 34 (i.e., an electron tube used to generate or amplify electromagnetic radiation in the microwave region by velocity modulation) that generates a proton beam 36 (FIG. 5A) or an elongated proton beam 37 (FIG. 5B) out from an accelerator 38 directed toward the outer surface 40 of the ingot 22. It is preferred that the klystron 34 include a Direct Current Gun or a Pelletron accelerator 38, but other comparable accelerator devices known in the art, such as a radio frequency ("RF") accelerator, may be used as well. The accelerator 38 (e.g., an RF resonant cavity) guides microwaves from the klystron source 34 into a resonant cavity to produce high gradient electromagnetic fields that accelerate protons to a desired energy level. This minimizes the size of the microwave device (high eV/m), while maintaining high production value. In this respect, one klystron 34 may be attached to many RF resonant accelerating cavities (for example, additional accelerators 38', 38" as illustrated in FIG. 5A) by use of a highway of intersecting electromagnetic waveguides. Thus, an entire factory yielding Gigawatt per year production of PV material can be powered by just a single klystron 34. The resonant cavities are designed to maximize the quality factor, or Q value, thus minimizing the needed input energy of the microwave source.

The next step as shown in FIG. 1 is to penetrate a selected layer of the rotating ingot 22 parallel to its axis of rotation 108. Exemplary devices known in the art for penetrating and essentially exfoliating a select surface depth of wafer material are shown and described, for example, in the aforementioned U.S. Pat. No. 7,939,812 to Glavish et al., U.S. Pat. No. 7,982, 197 to Smick et al., U.S. Pat. No. 7,989,784 to Glavish et al., and U.S. Pat. No. 8,044,374 to Ryding et al. Here, the proposed method bombards the outer surface 40 of the ingot 22 to a predetermined depth 42 (FIG. 6) with the proton beam 36, 37 having energized protons preferably ranging in energy level from 0.2-2.5 megaelectron volt ("MeV"). Accordingly, the protons penetrate the ingot 22 to a skin depth 42 of approximately 3-30 micrometers. As the ingot 22 rotates about its axis 32, the proton beam 36, 37 continuously energizes a new layer of the outer surface 40. Of course, the depth 42 may vary depending on the type of microwave device, the energy level generated within the proton accelerator 38, etc. This proton bombardment step 108 allows a layer 44 of the bombarded surface 40 to be peeled or exfoliated away from the body of the ingot 22 and onto a continuous conveyor 46 as generally shown in FIG. 7. The skin depth 42 ranges from 3-30 micrometers depending on the energy of the injected protons.

During step 108, the bombarded surface of the ingot 22 increases in temperature as a result of the proton beam 36, 37. As such, a cooling mechanism is preferably utilized to cool the outer surface 40 of the ingot 22 to prevent adverse or unexpected changes in the material properties of the ingot 22 due to heating. In this respect, it is particularly important to cool the area in and around the ingot 22 being exfoliated. Water or air circulation-based cooling devices may be used with the processes disclosed herein to provide either direct or indirect cooling of the ingot 22.

Figure 6:
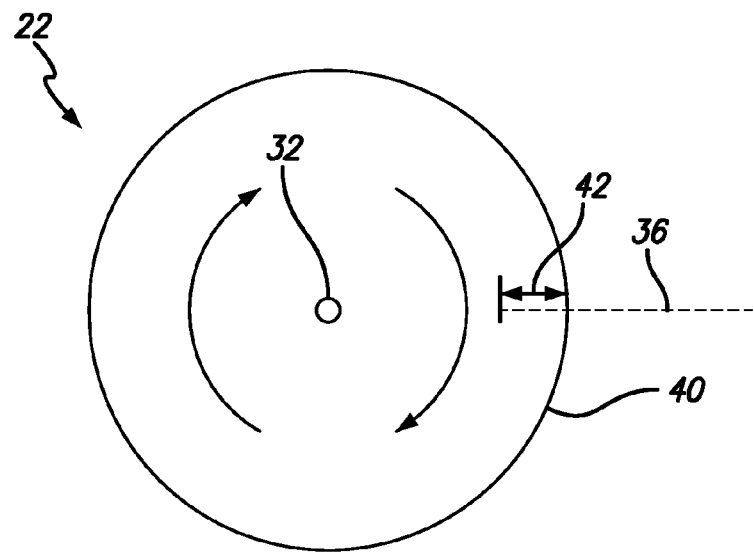
FIG. 6 is a diagrammatic side view of the ingot, illustrating protons penetrating the outer surface of the ingot to a predetermined depth.
Figure 7:
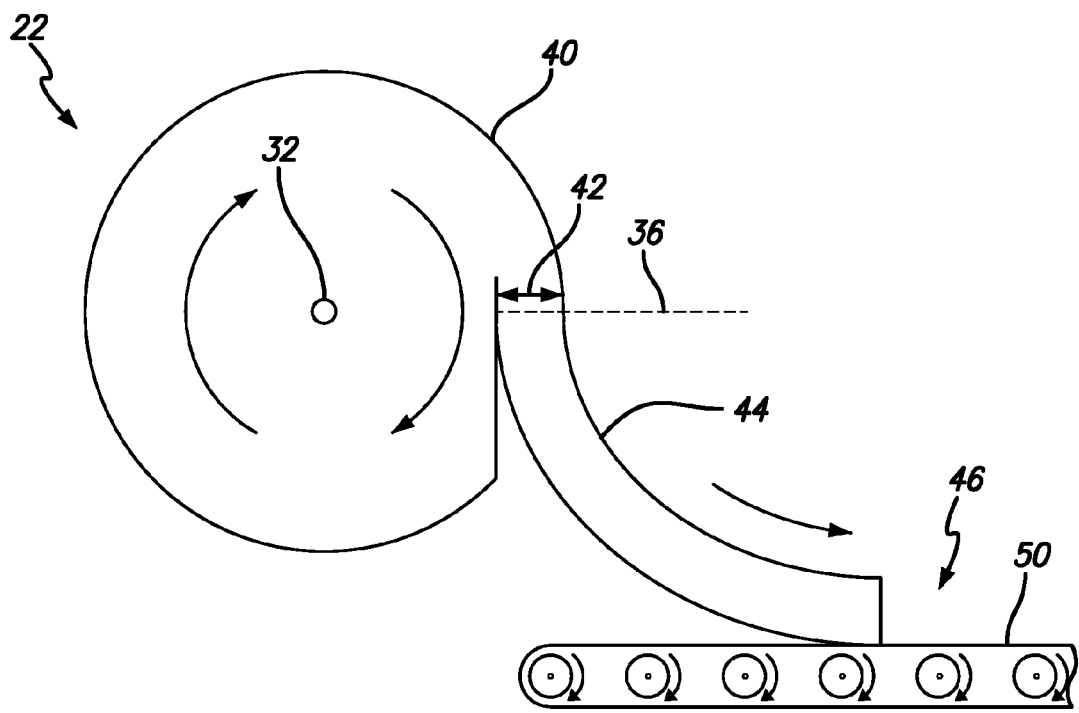
FIG. 7 is a diagrammatic side view of the ingot, illustrating exfoliation of the ingot.

The thickness of the exfoliated layer 44 is exaggerated in FIGS. 6 and 7 for illustrative purposes. In this respect, a person of ordinary skill in the art will readily recognize that relative thicknesses of this exfoliated layer 44 will be much thinner than the initial thickness of the ingot 22 made in accordance with step 100. As the ingot 22 is continuously exfoliated about its axis 32, its diameter will decrease in size and the relative size differential relative to the depth 42 of the exfoliated layer 44 will decrease.

Figure 8A:
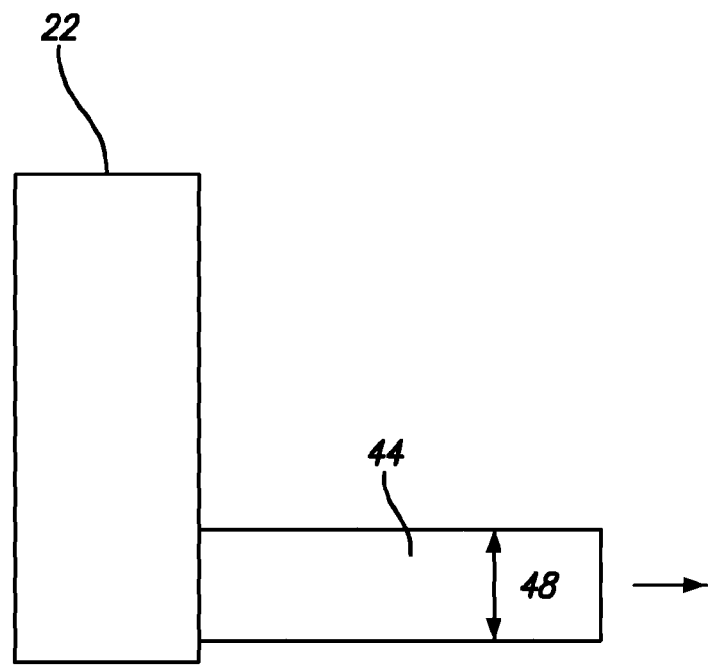
FIG. 8A is a diagrammatic top view of the bombarded ingot, illustrating single layer exfoliation.
Figure 8B:
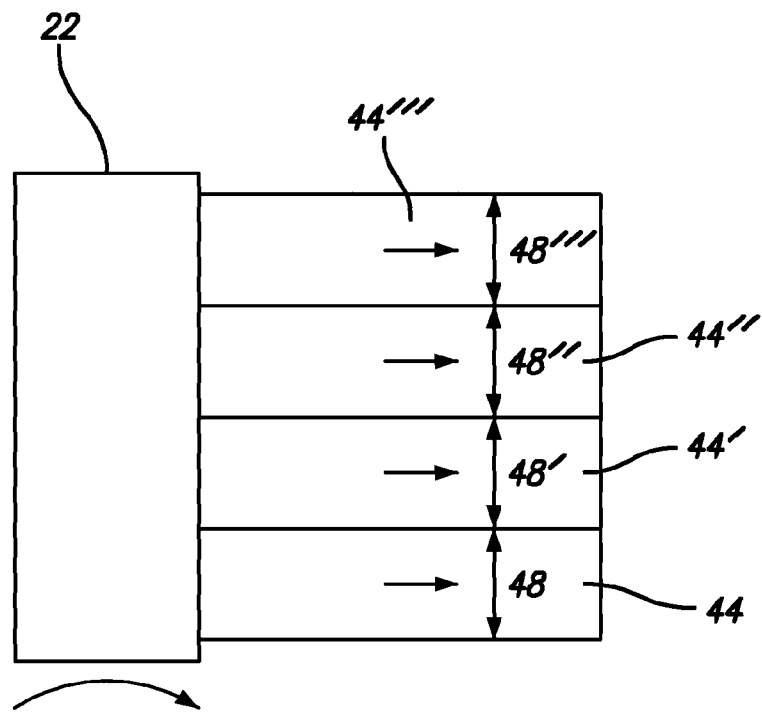
FIG. 8B is an alternative diagrammatic top view of the bombarded ingot, illustrating multi-layer exfoliation.

In general, the beam 36 or the elongated beam 37 needs to energize a portion of the ingot 22 along its length thereof in accordance with the desired width of the resultant wafer. This process may vary depending on the type of beam 36, 37 and the length of the ingot 22 created in step 100. For example, FIG. 5A illustrates one embodiment wherein a single beam 36 emits from one accelerator 38. Here, the beam 36 contacts a portion of the outer surface 40 at a single point. To create the layer 44 having a width 48 (FIGS. 8A, 8B), the beam 36 may move left-to-right and right-to-left along the longitudinal axis of the ingot 22 (i.e., parallel to the height or axis 32 of the ingot 22) to energize the full width 48 of the ingot 22. In this embodiment, the ingot 22 may incrementally rotate to allow the beam 36 to successfully traverse the width 48. Once it has done so, the ingot 22 rotates forward so the next increment of the outer surface 40 can be energized and exfoliated away from the body of the ingot 22. Additional accelerators 38', 38'', 38''' producing additional beams 36', 36'', 36''' may be included with the klystron 34 so that the entire width of the ingot 22 can be processed and exfoliated simultaneously to create, for example, layers 44, 44', 44'' as shown in FIG. 8B. Alternatively, in lieu of the moving any one of the beams 36, 36', 36'', the accelerators 38, 38', 38'', or the klystron 34, the ingot 22 itself may traverse back and forth.

Alternatively, as shown in FIG. 5B, the klystron 34 may produce the elongated beam 37 having a beam width equal to the width 48 of the desired finalized wafer. Similar to that described above with respect to the beam 36, multiple elongated beams 37, 37', 37'' (additional beams 37', 37'' not shown in FIG. 5B) may be used to exfoliate part of or substantially the entire width of the ingot 22 in a manner similar to that described above with respect to FIG. 8B. The advantage of using one or more of the elongated beams 37 is that it may not be necessary to stop or increment rotation of the ingot 22 about its axis 32. In this respect, rotation and cooling of the ingot 22 may be timed to specifically facilitate continuous exfoliation as the beam 37 would not otherwise require longitudinal movement along the length of the ingot 22, as does the beam 36.

The next step as shown in FIG. 1 is to remove the layer of penetrated wafer material from the ingot 110. As described above, the ingot 22 rotates angularly about the axis of rotation 32 so that the beam 36, 37 does not overlap any previously bombarded area of the surface 40. As the bombardment process continues, the layer 44 of exfoliated material peels away from the ingot 22 on to the conveyor 46. The conveyor 46 may include a metal substrate 50 or other comparable surface having a high enough coefficient of friction to grasp or pull the exfoliated layer 44 away from the ingot 22, as generally shown in FIG. 7. This prevents the exfoliated layer 44 from bunching near the surface 40 as the ingot 22 rotates.

The rotation of the ingot 22 permits simultaneous exfoliation and removal of exfoliated material in a single, continuous sheet. More specifically, as the ingot 22 rotates the portion of the outer surface 40 of the ingot 22 being exfoliated changes as the angular position of the ingot 22 changes. Simultaneously, this rotation causes the layer of exfoliated wafer 44 material to peel off of the ingot 22 as the ingot 22 rotates. Since the exfoliated layer 44 continuously peels off the ingot 22 as its angular position changes, a single continuous sheet of wafer material is produced. That is, the rotating ingot 22 "unwinds" in the same manner that a roll of paper or a coil of metal. This process provides a large savings over conventional exfoliation processes since a continuous sheet of exfoliated wafer material is produced.

The removal step 110 produces a ribbon of one or more substrate layers 44, 44', 44'' (e.g., as shown in FIG. 8B) of wafer material 3-30 micrometers thick, depending on the bombarding proton energy. The ingot 22 moves forward a distance equal to the width of the metal substrate producing exactly enough material to be exfoliated onto the metal substrate 50 of the conveyor 46. The width of the metal substrate will correspond to the width 48 of the bombarded ingot surface, and can range from 160-200 mm.

Figure 9:
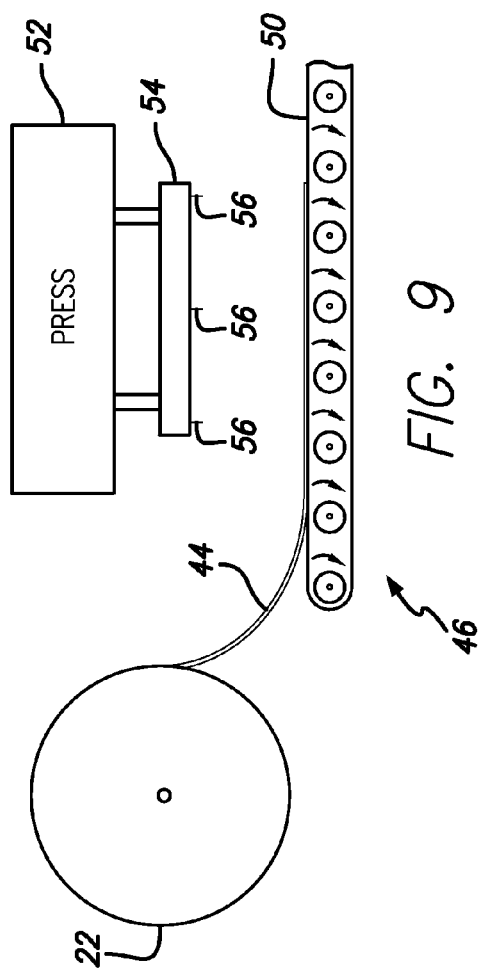
FIG. 9 is a diagrammatic side view illustrating conveying the exfoliated layer away from the ingot.
Figure 10:
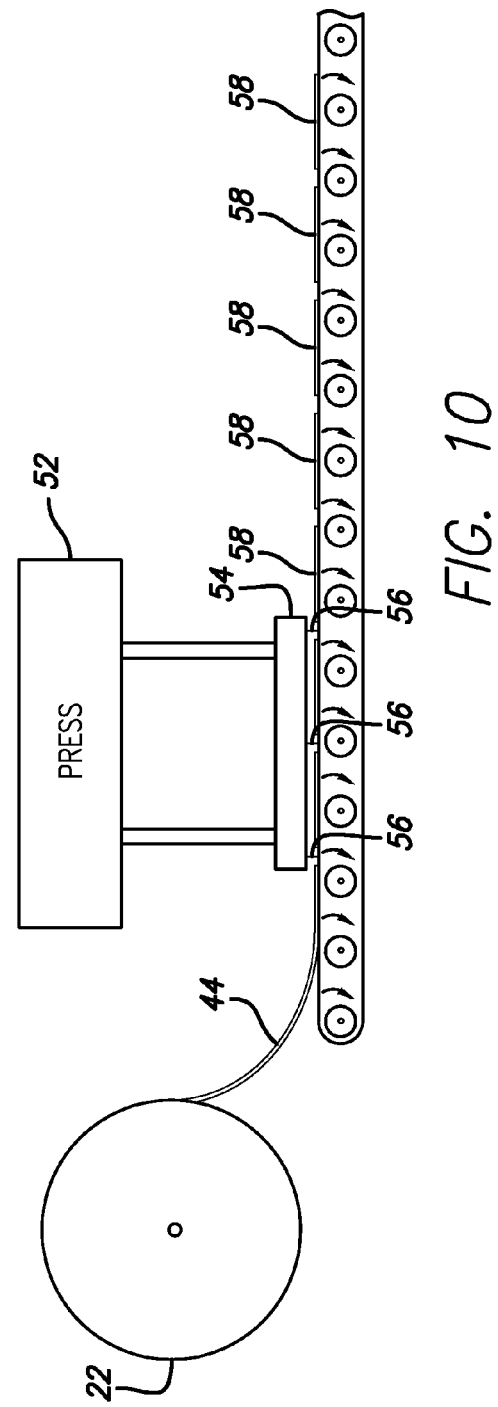
FIG. 10 is a diagrammatic side view illustrating cutting the exfoliated layer into individual wafers.

This new ribbon or layer 44 of metal substrate with PV material is then conveyed away from the ingot 22 during step 112 for subsequent stamping 114 into individual wafers (FIG. 1). In this respect, FIG. 9 illustrates movement of the layer or strip of exfoliated wafer material 44 away from the ingot 22 and toward a press 52 having a die 54 with one or more blades 56 designed to cut or shear the ribbon or layer 44 into individual wafers 58 (FIG. 10) at specific intervals. For example, when the press 52 extends the die 54 downwardly as shown in FIG. 10, the blades 56 contact and cut the strip of wafer material 44 into wafers 58 at intervals such as every 160-200 mm, thereby producing 160×160 mm wafers or 200×200 mm wafers. While these sizes may be the current dimensions of an average square PV wafer, the size of the wafer 58 should not be limited thereto. That is, the resultant size of the wafer 58 could be larger or smaller depending on the technology used to cut the layer 44 into the individual wafers 58. Furthermore, any device known in the art for slicing or cutting strips of wafer material may be utilized to create the wafers 58 from the strip or layer 44, such as alternative stamping or sawing mechanisms. Preferably, such a cutting or sawing step should create as little residual wafer material waste as possible. At this point, the final product is a square or rectangular PV wafer 58 that can run through conventional wiring and packaging machinery to produce a complete solar panel for use in residential, commercial, or utility scale solar energy production.

Of course, the processes and apparatuses described above should not be limited only to use with monocrystalline silicon ingots. Such processes and apparatuses may be applied to ingots of various shapes, sizes and materials, such as any type of metal material cast into a shape suitable for further processing as disclosed herein.

For example, the ingot 22 may have a polygonal cross section. An ingot having such a shape may be rotated about its longitudinal axis in the same manner as a cylindrical ingot. Most rotationally processed work pieces (i.e. work pieces turned on a rotator or lathe) must be cylindrical so the tool (i.e. lathe cutter) remains in contact with the work piece throughout the entire 360-degree rotation thereof. The exfoliation process, however, does not require a fixed position tool to remain in constant contact with the ingot. Instead, an energized beam that can accommodate the varying rotational diameter of a non-circular, rotating object preferably processes the work piece ingot. That is, the energized beam bombards the outer surface of the ingot and penetrates a layer of wafer material even though the diameter of the rotating ingot has a polygonal cross section that varies angularly. Therefore, ingots having a polygonal cross section may be exfoliated in the same manner as cylindrical ingots, as discussed in greater detail above.

Additionally, the wafer material is not limited to monocrystalline silicon. Any suitable material known in the art for construction of wafers may be used, including, but not limited to, polycrystalline silicon, cadmium telluride, sapphire crystal, and copper indium gallium selenide. Moreover, the wafer material can be either an n-type or p-type material. Obviously, the type and concentration of dopants and the specific processing parameters, such as temperatures, may vary depending on the choice of wafer material.

Although several embodiments have been described in detail for purposes of illustration, various modifications may be made without departing from the scope and spirit of the invention. Accordingly, the invention is not to be limited, except as by the appended claims.

What is claimed is:

1. A process for manufacturing wafers, comprising the steps of:
   mounting an ingot as a work piece in a manner that permits rotation about a longitudinal axis of rotation;
   rotating said ingot about said longitudinal axis of rotation;
   energizing an accelerator device for generating an energized beam sufficient for penetrating an outer surface layer of said rotating ingot;
   exfoliating said outer surface layer with said energized beam;
   applying a coolant directly to said outer surface layer of said ingot for cooling said ingot at a penetration point where said energized beam bombards said outer surface layer of said solid core ingot;
   removing said exfoliated outer surface layer from said ingot as a continuous planar strip; and
   cutting said continuous planar strip into a wafer.

2. The process of claim 1, wherein said removing step includes the step of transversely moving said continuous planar strip along a conveyor synchronized with said rotating ingot.

3. The process of claim 1, wherein said energized beam comprises an energy level between 0.3-1.7 megaelectron volts.

4. The process of claim 1, including the step of calibrating said accelerator device to maximize a Q value.

5. The process of claim 1, wherein said accelerator device includes a klystron for generating said energized beam comprising a proton beam or an ion beam.

6. The process of claim 1, wherein said ingot comprises a cylinder carried by a rotatable shaft mountable to a rotor for rotating said cylindrical ingot about said longitudinal axis of rotation.

7. The process of claim 1, wherein said cutting step comprises the step of stamping said continuous planar strip into a plurality of wafers.

8. The process of claim 1, wherein said energized beam comprises a width approximately the width of said wafer.

9. The process of claim 8, wherein said wafer comprises a width between 160-200 mm.

10. The process of claim 1, wherein said ingot comprises monocrystalline or polycrystalline silicon.

11. The process of claim 1, wherein said energized beam comprises multiple energized beams simultaneously exfoliating respective outer surface layers of said rotating ingot into multiple respective exfoliated outer surface layers.

12. The process of claim 1, wherein said rotating step includes the step of incrementally rotating said ingot.

13. The process of claim 1, wherein said outer surface layer comprises a thickness between 3-30 micrometers.

14. A process for manufacturing wafers, comprising the steps of:
   mounting a solid core ingot comprising a cylinder carried by a rotatable shaft mountable to a rotor for rotating said cylindrical solid core ingot about a longitudinal axis of rotation in a vacuum chamber;
   rotating said solid core ingot about said longitudinal axis of rotation in said vacuum chamber;
   energizing an accelerator device comprising a klystron for generating an energized beam comprising a proton beam or an ion beam sufficient for penetrating an outer surface layer of said rotating solid core ingot;
   exfoliating said outer surface layer with said energized beam in said vacuum chamber;
   cooling said solid core ingot at a penetration point where said energized beam bombards said outer surface layer of said solid core ingot simultaneously while exfoliating said outer surface layer with said energized beam while rotating said solid core ingot about said longitudinal axis of rotation in said vacuum chamber;
   removing said exfoliated outer surface layer from said solid core ingot as a continuous planar strip and transversely moving said continuous planar strip along a conveyor synchronized with said rotating solid core ingot; and
   stamping said continuous planar strip into a plurality of wafer.

15. The process of claim 14, including the step of calibrating said accelerator device to maximize a Q value, wherein said energized beam comprises an energy level between 0.3-1.7 megaelectron volts.

16. The process of claim 14, wherein said wafer comprises a width between 160-200 mm, and said energized beam comprises a width approximately the width of said wafer.

17. The process of claim 14, wherein said energized beam comprises multiple energized beams simultaneously exfoliating respective outer surface layers of said rotating solid core ingot into multiple respective exfoliated outer surface layers and said solid core ingot comprises monocrystalline or polycrystalline silicon.

18. The process of claim 14, wherein said rotating step includes the step of incrementally rotating said solid core ingot and said outer surface layer comprises a thickness between 3-30 micrometers.

19. An apparatus for manufacturing wafers from a solid core ingot work piece, comprising:
- a rotator configured to selectively mountably receive and rotate said solid core ingot about a longitudinal axis of rotation;
- an accelerator for producing an energized beam, said accelerator being positioned relative to said rotator such that said energized beam aligns with said longitudinal axis of rotation, said energized beam comprising an energy level sufficient to penetrate an outer surface layer of said rotating solid core ingot;
- a water cooler or an air cooler positioned to apply coolant directly to said outer surface layer of said solid core ingot to cool a penetration point where said energized beam bombards said outer surface layer of said solid core ingot for controlling a surface temperature of said rotating solid core ingot;
- a conveyor synchronized with said rotating solid core ingot to transversely carry as a continuous planar strip an exfoliated outer surface layer away from said rotating solid core ingot; and
- a cutter for cutting said continuous planar strip into one or more wafers.

20. The apparatus of claim 19, wherein said cutter comprises a stamping die for cutting multiple wafers with each stroke.

21. The apparatus of claim 19, wherein said accelerator includes a klystron.

22. The apparatus of claim 21, wherein said klystron includes an energy accelerator comprising a Direct Current Gun or a Pelletron accelerator.

23. The apparatus of claim 19, wherein said energized beam comprises an ion beam or a proton beam.

24. The apparatus of claim 19, wherein said energized beam comprises an elongated beam approximately the width of said wafer.

25. The apparatus of claim 24, wherein said wafer comprises a width between 160-200 mm and a thickness between 3-30 micrometers.

26. The apparatus of claim 19, wherein said solid core ingot comprises a cylindrical monocrystalline silicon or polycrystalline silicon.

* * * * *